US009929458B2

(12) United States Patent
Leipold et al.

(10) Patent No.: US 9,929,458 B2
(45) Date of Patent: Mar. 27, 2018

(54) HYBRID CAVITY AND LUMPED FILTER ARCHITECTURE (71) Applicant: RF Micro Devices, Inc., Greensboro, NC (US)

(72) Inventors: Dirk Robert Walter Leipold, San Jose, CA (US); George Maxim, Saratoga, CA (US); Baker Scott, San Jose, CA (US)

(73) Assignee: Qorvo US, Inc., Greensboro, NC (US)

( * ) Notice: Subject to any disclaimer, the term of this patent is extended or adjusted under 35 U.S.C. 154(b) by 39 days.

(21) Appl. No.: 14/931,689

(22) Filed: Nov. 3, 2015

(65) Prior Publication Data

US 2016/0126613 A1 May 5, 2016

Related U.S. Application Data (60) Provisional application No. 62/074,446, filed on Nov. 3, 2014.

(51) Int. Cl.
| H01P 1/20 | (2006.01) |
| H01P 7/06 | (2006.01) |
| H01L 21/027 | (2006.01) |
| H01L 49/02 | (2006.01) |
| H03H 9/24 | (2006.01) |
| H01P 7/08 | (2006.01) |

(52) U.S. Cl.
CPC ............ *H01P 7/06* (2013.01); *H01L 21/0276* (2013.01); *H01L 28/10* (2013.01); *H01P 7/065* (2013.01); *H01P 7/08* (2013.01); *H03H 9/24* (2013.01)

(58) Field of Classification Search
CPC ... H01P 7/06; H01P 7/065; H01P 7/08; H01L 21/0276; H01L 28/10; H03H 9/24
USPC .................................................. 333/202, 227
See application file for complete search history.

(56) References Cited

U.S. PATENT DOCUMENTS

| 4,205,286 | A | * | 5/1980 | Parish ..................... H01P 7/005 333/226 |
| 4,459,571 | A | * | 7/1984 | Fraser ................... H01P 1/2053 333/202 |
| 5,478,773 | A |   | 12/1995 | Dow et al. |
| 6,031,445 | A |   | 2/2000 | Marty et al. |
| 6,291,872 | B1 |   | 9/2001 | Wang et al. |
| 6,833,781 | B1 |   | 12/2004 | Padmanabhan et al. |
| 8,212,155 | B1 |   | 7/2012 | Wright et al. |
| 8,325,001 | B2 |   | 12/2012 | Huang et al. |

(Continued)

OTHER PUBLICATIONS

Notice of Allowance and Examiner-Initiated Interview Summary for U.S. Appl. No. 14/931,621, dated Jan. 4, 2017, 10 pages.

(Continued)

*Primary Examiner* — Robert J Pascal
*Assistant Examiner* — Kimberly Glenn
(74) *Attorney, Agent, or Firm* — Withrow & Terranova, P.L.L.C.

(57) ABSTRACT

A resonator includes an inductive element and a conductive cavity surrounding the inductive element. In particular, the conductive cavity surrounds the inductive element such that a capacitance is distributed between the inductive element and the conductive cavity. By distributing a capacitance between the inductive element and the conductive cavity, a high quality-factor resonator can be achieved by the resonator with a relatively small form factor.

16 Claims, 9 Drawing Sheets

(56) References Cited

U.S. PATENT DOCUMENTS

| | | |
|---|---|---|
| 2004/0212038 A1 | 10/2004 | Ott et al. |
| 2005/0082669 A1 | 4/2005 | Saijo et al. |
| 2006/0262820 A1 | 11/2006 | Itoh et al. |
| 2008/0002380 A1 | 1/2008 | Hazucha et al. |
| 2008/0297299 A1 | 12/2008 | Yun et al. |
| 2011/0090036 A1 | 4/2011 | Kuroda et al. |
| 2014/0266544 A1 | 9/2014 | Leipold et al. |
| 2014/0323046 A1 | 10/2014 | Asai et al. |
| 2015/0035637 A1 | 2/2015 | Maxim et al. |
| 2015/0279921 A1 | 10/2015 | Lam et al. |
| 2016/0013667 A1 | 1/2016 | Hosotani et al. |
| 2016/0020013 A1 | 1/2016 | Berdy et al. |
| 2016/0156390 A1 | 6/2016 | Kuroda |

OTHER PUBLICATIONS

Supplemental Notice of Allowability for U.S. Appl. No. 14/931,621, dated Apr. 14, 2017, 4 pages.
Non-Final Office Action for U.S. Appl. No. 14/929,608, dated May 11, 2017, 13 pages.
Final Office Action for U.S. Appl. No. 14/929,608, dated Dec. 14, 2017, 8 pages.

* cited by examiner

HYBRID CAVITY AND LUMPED FILTER ARCHITECTURE

RELATED APPLICATIONS

This application claims the benefit of U.S. provisional patent application No. 62/074,446, filed Nov. 3, 2014, the disclosure of which is incorporated herein by reference in its entirety.

FIELD OF THE DISCLOSURE

The present disclosure is related to resonators, and in particular to high quality-factor resonators with compact designs.

BACKGROUND

Figures 1, 2:
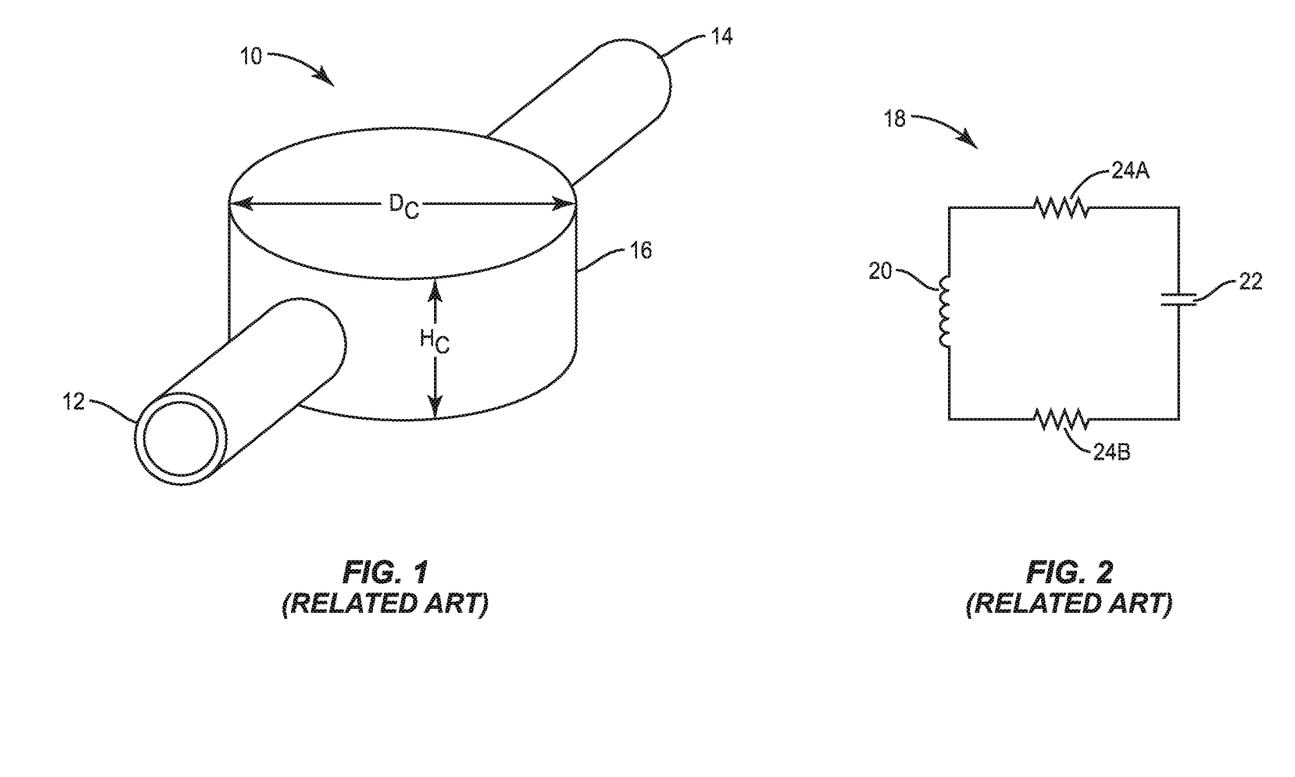
FIG. 1 illustrates a conventional cavity resonator.
FIG. 2 illustrates a conventional LC resonator.

Resonators are used in a variety of applications in mobile communications devices. In particular, resonators are often used in filters for mobile communications devices. Resonators for filters generally demand a high quality factor (Q) and selectivity. One conventional type of resonator is illustrated in FIG. 1. Specifically, FIG. 1 shows a cavity resonator 10. The cavity resonator 10 includes an input port 12, an output port 14, and a resonant cavity 16. Radio frequency (RF) signals provided at the input port 12 enter the resonant cavity 16. The RF signals bounce between the walls of the resonant cavity 16, forming standing waves at a resonant frequency that is determined by a diameter $D_C$ of the resonant cavity 16 and a height $H_C$ of the resonant cavity 16, among other factors that will be understood by those of ordinary skill in the art. The standing waves are then propagated to the output port 14. While the cavity resonator 10 provides a high quality factor, it is too large to fit into a mobile communications device. Further, the cavity resonator 10 is not tunable, as the resonant response thereof is fixed by the geometry of the device.

Figure 3:
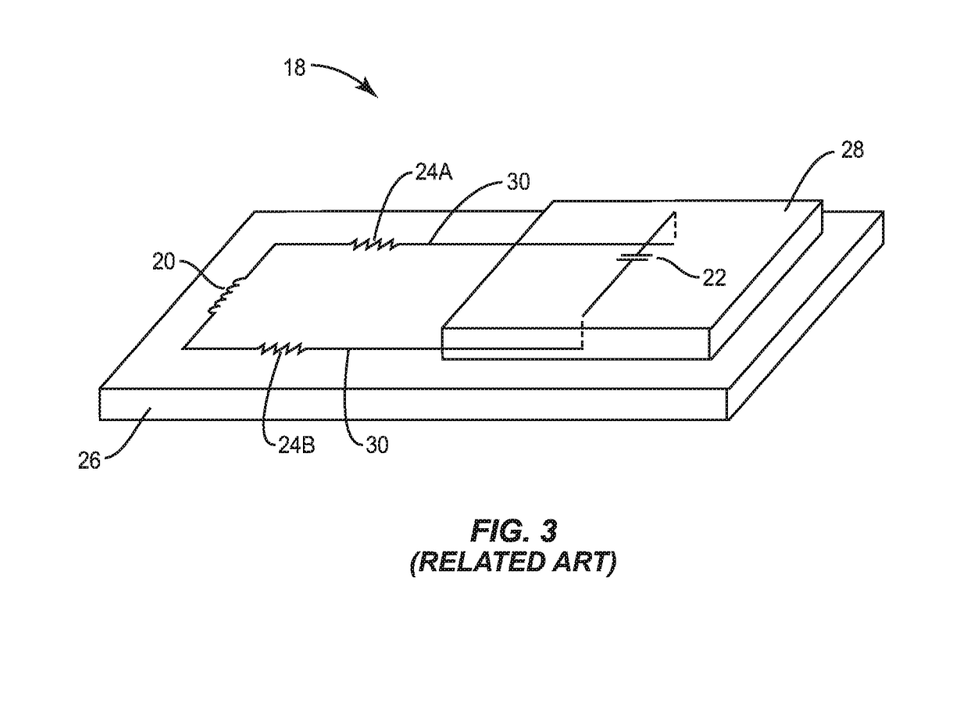
FIG. 3 illustrates details of the conventional LC resonator shown in FIG. 2.

An additional type of conventional resonator is illustrated in FIG. 2 and FIG. 3. Specifically, FIG. 2 and FIG. 3 show an LC resonator 18. The LC resonator 18 includes an inductive element 20 and a capacitive element 22. A first parasitic resistance 24A and a second parasitic resistance 24B are also illustrated. A signal provided to the LC resonator 18 will oscillate between storage in the magnetic field of the inductive element 20 and the electric field of the capacitive element 22. The particular inductance and capacitance, respectively, of the inductive element 20 and the capacitive element 22 determine the speed at which this oscillation occurs, and thus the resonant frequency of the LC resonator 18. While the LC resonator 18 is significantly more compact than the cavity resonator 10 and may be tuned by altering the capacitance of the capacitive element 22, the quality factor of the LC resonator 18 is generally quite low due to the parasitic resistance 24 between the inductive element 20 and the capacitive element 22 and the internal resistive losses of the inductor element 20 and the capacitive element 22. In particular, FIG. 3 shows how the LC resonator 18 is normally fabricated, wherein the inductive element 20 is provided on a laminate 26, and connected to the capacitive element 22 on a separate chip 28 via a number of interconnects 30. The parasitic resistance 24 is generally due to the length and quality of the interconnects 30, as well as the internal resistance of the components themselves as discussed above. As energy is passed between the inductive element 20 and the capacitive element 22, the parasitic resistance 24 dissipates a part of this energy, thus damping the resonant response and lowering the quality factor of the LC resonator 18.

Specifically, Equation (1) illustrates the relationship between parasitic resistance and quality factor:

$$Q = \frac{1}{R}\sqrt{\frac{L}{C}} = \frac{\omega_0 L}{R} \quad (1)$$

where Q is the quality factor of the LC resonator 18, R is the parasitic resistance of the first parasitic resistance 24A and the second parasitic resistance 24B, L is the inductance of the inductive element 20, C is the capacitance of the capacitive element 22, and $\omega_0$ is the resonant frequency of the LC resonator 18. As Equation (1) illustrates, the quality factor is inversely proportional to the parasitic resistance. Due to the length and quality of the interconnects 30 discussed above, the quality factor of the LC resonator 18 is limited.

Accordingly, there is a need for a resonator with a high quality factor and a small form factor.

SUMMARY

The present disclosure relates to resonators for use in mobile communications devices. In one embodiment, a resonator includes an inductive element and a conductive cavity surrounding the inductive element. In particular, the conductive cavity surrounds the inductive element such that a capacitance is distributed between the inductive element and the conductive cavity. By distributing a capacitance between the inductive element and the conductive cavity, a high quality-factor can be achieved by the resonator while maintaining a relatively small form factor.

In one embodiment, the conductive cavity is coupled to a fixed potential.

In one embodiment, the inductive element includes a conductive path routed along the periphery of a volume between an input node and an output node such that the inductive element is a three-dimensional inductor. The conductive path may have a length greater than about 0.5 mm. A delay between the input node and the output node may be greater than about 0.5 ns and less than about 500 ns.

In one embodiment, the conductive cavity encloses the volume such that the conductive path runs parallel to one or more surfaces of the conductive cavity.

In one embodiment, the inductive element includes an intermediate node between the input node and the output node. A delay between the input node and the output node may be different than a delay between the input node and the intermediate node.

In one embodiment, a tunable capacitive element may be coupled to the inductive element.

In one embodiment, a filter includes a number of inductive elements, a number of tunable capacitive elements each coupled to a different one of the inductive elements, and a conductive cavity that surrounds at least the inductive elements such that a capacitance is distributed between each one of the inductive elements and the conductive cavity.

In one embodiment, the conductive cavity is coupled to a fixed potential.

In one embodiment, the inductive elements each include a conductive path routed along the periphery of a volume between an input node and an output node such that the inductive element is a three-dimensional inductor. The conductive path may have a length greater than about 0.5 mm. A delay between the input node and the output node may be greater than about 0.5 ns and less than about 500 ns.

In one embodiment, the conductive cavity encloses the volume of each inductive element such that the conductive path of each inductive element runs parallel to one or more surfaces of the conductive cavity.

In one embodiment, each one of the inductive elements includes an intermediate node between the input node and the output node. A delay between the input node and the output node may be different than a delay between the input node and the intermediate node.

Those skilled in the art will appreciate the scope of the disclosure and realize additional aspects thereof after reading the following detailed description in association with the accompanying drawings.

BRIEF DESCRIPTION OF THE DRAWINGS

The accompanying drawings incorporated in and forming a part of this specification illustrate several aspects of the disclosure, and together with the description serve to explain the principles of the disclosure.

DETAILED DESCRIPTION

The embodiments set forth below represent the necessary information to enable those skilled in the art to practice the disclosure and illustrate the best mode of practicing the disclosure. Upon reading the following description in light of the accompanying drawings, those skilled in the art will understand the concepts of the disclosure and will recognize applications of these concepts not particularly addressed herein. It should be understood that these concepts and applications fall within the scope of the disclosure and the accompanying claims.

Figure 4:
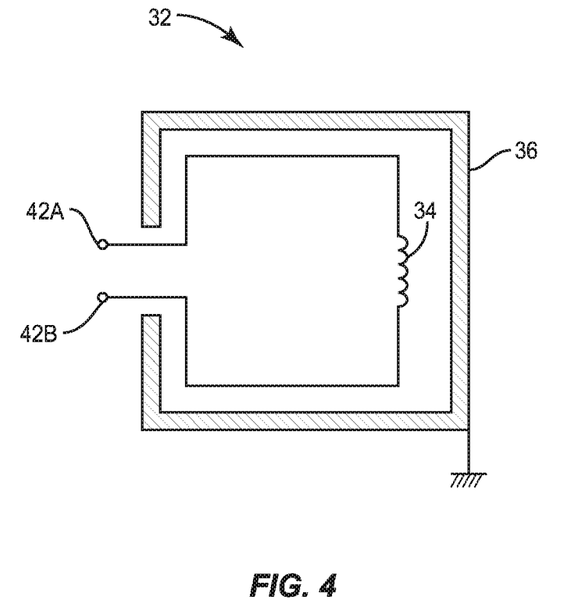
FIG. 4 illustrates a resonator according to one embodiment of the present disclosure.
Figure 5:
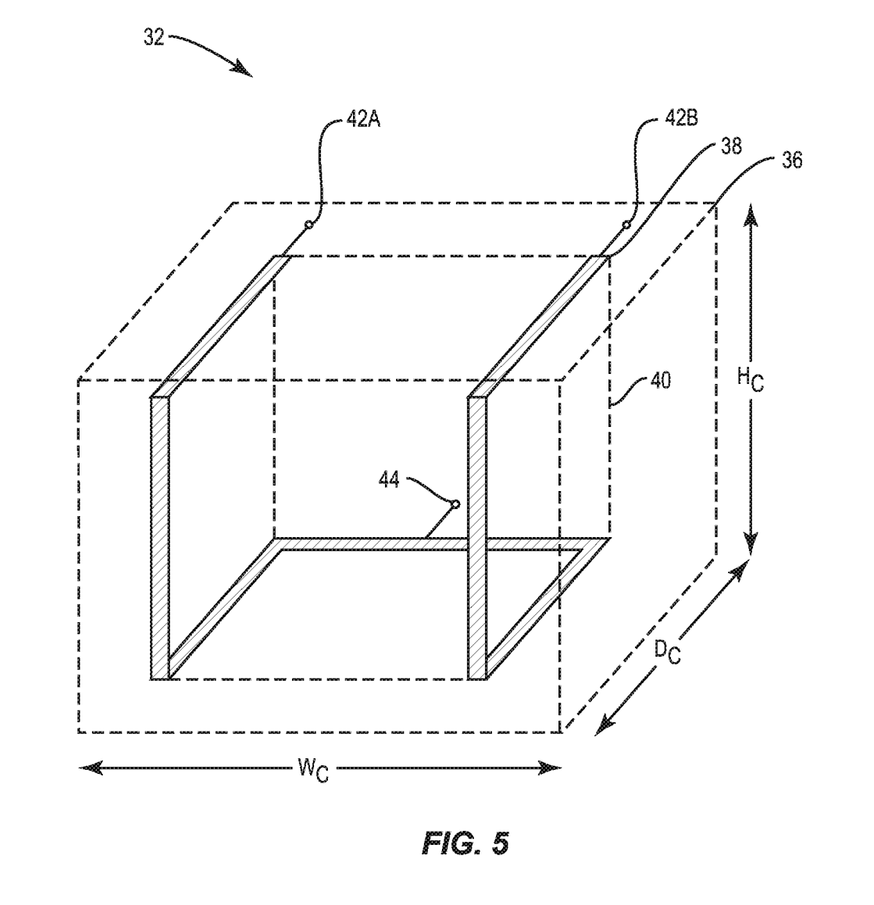
FIG. 5 illustrates details of the resonator shown in FIG. 4 according to one embodiment of the present disclosure.

FIG. 4 and FIG. 5 illustrate a resonator 32 according to one embodiment of the present disclosure. The resonator 32 includes an inductive element 34 within a conductive cavity 36. The inductive element 34 may be a conductive path 38 that runs along the periphery of a volume, and is supported by a substrate 40 (shown as transparent), which may be, for example, a laminate. In other words, the inductive element 34 is a three-dimensional inductor. The substrate 40 supports the conductive path 38 in order to provide a desired length and arrangement thereof. The conductive cavity 36 surrounds the conductive path 38 such that one or more portions of the conductive path 38 run parallel to a surface of the conductive cavity 36 without contacting the conductive cavity 36. Accordingly, a capacitance is distributed between the conductive cavity 36 and the conductive path 38, and in particular across the length of the conductive path 38 running parallel to a surface of the conductive cavity 36.

The particular arrangement of the conductive path 38 shown in FIG. 5 may provide magnetic field cancellation between various points thereof. In particular, the folded shape of the conductive path 38 may lead to partial cancellation of the magnetic field from opposing sides thereof, thereby reducing a total inductance between an input node 42A and an output node 42B. In other words, while the length of the conductive path 38 may be relatively long, for example, between 0.5 mm and 20 mm, the inductance between the input node 42A and the output node 42B may be between about 0.5 nH and 10 nH. The length of the conductive path 38 may generate delays (i.e., a phase shift) for a signal passing from the input node 42A to the output node 42B, thereby creating a distributed inductance that is more similar to a cavity type component than a lumped component. In one embodiment, the delay between the input node 42A and the output node 42B is greater than about 0.5 ns and less than about 500 ns.

The delay due to the length of the conductive path 38 may be useful for increasing the sharpness of roll-off when the resonator is used in a filter. As will be appreciated by those of ordinary skill in the art, an increase in delay between the input node 42A and the output node 42B is analogous to increasing the order of a filter, and therefore may provide desirable performance characteristics in some applications. Further, due to the distributed inductance of the conductive path 38 discussed above, tapping the conductive path 38 at different points along the length thereof may provide different delays that may be used interchangeably. For example, a delay between the input node 42A and the output node 42B may be longer than a delay between the input node 42A and an intermediate node 44. While only one intermediate node 44 is shown, the conductive path 38 may include any number of intermediate nodes, each with a different delay with respect to the input node 42A. In some embodiments, switching circuitry (not shown) may be configured to switch between the intermediate nodes 44 in order to provide a particular amount of delay to a signal passing through the conductive path 38.

In one embodiment, the space between the conductive cavity 36 and the conductive path 38 is empty space filled with air or an inert gas. In other embodiments, the space between the conductive cavity 36 and the conductive path 38 is filled with an encapsulant material of some kind (e.g., an oxide). Further, while the conductive cavity 36 is shown as completely surrounding the conductive path 38, the conductive cavity 36 may be partially or completely open on one or more sides without departing from the principles of the present disclosure. In one embodiment, the conductive cavity 36 is substantially continuous over at least two sides of the conductive path 38. In another embodiment, the surfaces of the conductive cavity 36 are patterned into a grid. In yet another embodiment, the conductive cavity 36 is substantially continuous but includes openings to allow coupling to the conductive path 38 and any other components that may be placed therein.

The conductive cavity 36 may be coupled to a fixed potential. For example, the conductive cavity 36 is shown coupled to ground in the exemplary embodiment of FIG. 4. However, the conductive cavity 36 may be coupled to any fixed potential, may be left floating, or may be coupled to a time-varying or frequency-varying signal without departing from the principles of the present disclosure. The capacitance distributed between the conductive cavity 36 and the conductive path 38 occurs due to the proximity of the conductive materials to one another. Accordingly, there is little to no parasitic resistance to damp the resonant response of the resonator 32, resulting in a significant increase in the quality factor thereof when compared to a conventional LC resonator. In other words, the resonator 32 includes many of the desirable performance characteristics of a conventional cavity resonator with a form factor similar to a conventional LC resonator. In one embodiment, the resonator 32 has a quality factor greater than about 50 and a cross-sectional area less than about 1 mm². In particular, a width $W_C$ of the conductive cavity 36 may be less than about 2 mm, a depth $D_C$ of the conductive cavity 36 may be less than about 1 mm, and a height $H_C$ of the conductive cavity 36 may be less than about 0.5 mm, such that the resonator has a volume that is less than about 0.5 mm³. In another embodiment, the resonator volume is less than about 0.125 mm³.

Figure 6:
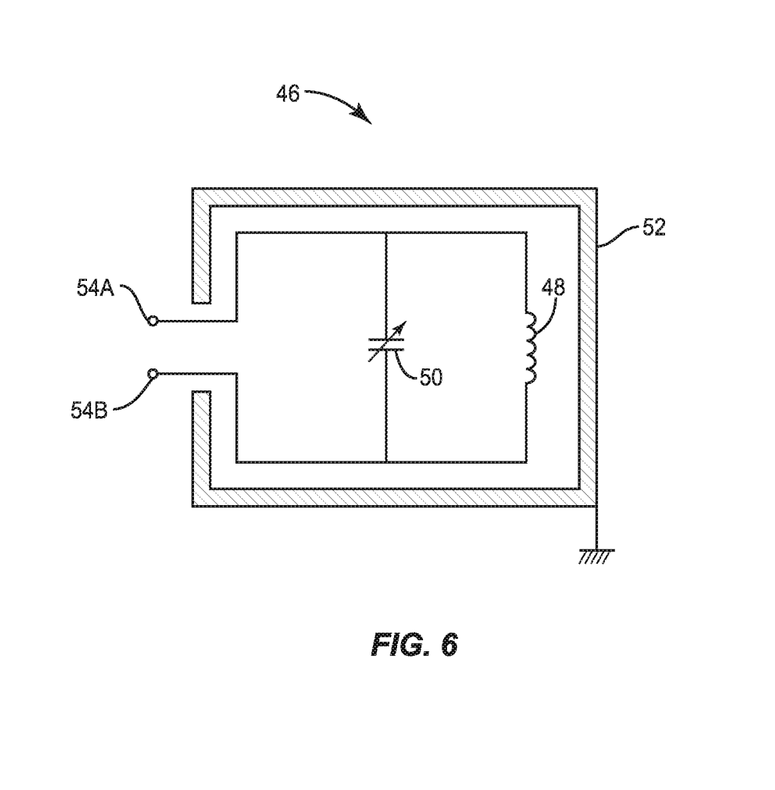
FIG. 6 illustrates a tunable resonator according to one embodiment of the present disclosure.

While the resonator 32 discussed above with respect to FIG. 4 and FIG. 5 provides improvements to performance with a small size, the resonator 32 is not tunable. Accordingly, FIG. 6 shows a tunable resonator 46 according to an additional embodiment of the present disclosure. The tunable resonator 46 includes an inductive element 48, a tunable capacitive element 50, and a conductive cavity 52. The inductive element 48 is within the conductive cavity 52. Further, in some embodiments the tunable capacitive element 50 is also within the conductive cavity 52, although the tunable capacitive element 50 may be outside of the conductive cavity 52 without departing from the principles of the present disclosure. The inductive element 48 may be a conductive path (similar to that shown above with respect to FIG. 5) that runs along the periphery of a volume and is supported by a substrate (not shown). The tunable capacitive element 50 may be a switched metal-insulator-semiconductor (MIS) capacitor, a semiconductor varactor, or the like. In one embodiment, the tunable capacitive element 50 is coupled in parallel with the inductive element 48 between an input node 54A and an output node 54B, however, the tunable capacitive element 50 may be coupled in any configuration with the inductive element 48 without departing from the principles of the present disclosure. The capacitance of the tunable capacitive element 50 may be changed, for example, via a control signal delivered to the tunable capacitive element 50, in order to adjust a resonant response of the tunable resonator 46.

Generally, the tunable capacitive element 50 should be located as close to the inductive element 48 as possible via a high quality connection to avoid introducing parasitic resistance and thus degradation of the quality factor of the tunable resonator 46 as discussed above. The distributed capacitance between the conductive cavity 52 and the inductive element 48 along with the capacitance of the tunable capacitive element 50 combine to determine the resonant response of the tunable resonator 46. As discussed above, the inductive element 48 may be a three-dimensional inductor made up of a relatively long conductive path and having a relatively large width to conduct an RF current. The inductive element 48 may be folded such in such a way (e.g., with vertical conductive paths oriented at 45° relative to a center of the inductive element 48) and provide relatively wide conductive paths to create a number of equal current path lengths. The distributed inductance and capacitance due to the length of the inductive element 48 and the interaction of the inductive element 48 with the conductive cavity 52 cause the tunable resonator 46 to behave more like a cavity resonator than an LC resonator. In general, this means that the tunable resonator 46 has a high quality factor and high selectivity. Further, the tunable resonator 46 has a small form factor when compared to a conventional cavity resonator. In one embodiment, the quality factor of the tunable resonator 46 is greater than about 50. Further, the cross-sectional area of the tunable resonator 46 may be less than about 2 mm², thereby allowing the tunable resonator 46 to be integrated into portable electronic devices such as mobile communications devices.

In one embodiment, the space between the inductive element 48 and the conductive cavity 52 is empty space filled with air or an inert gas. In other embodiments, the space between the inductive element 48 and the conductive cavity 52 is filled with an encapsulant material of some kind (e.g., an oxide). While the conductive cavity 52 is shown substantially enclosing the inductive element 48 (and the tunable capacitive element 50), the conductive cavity 52 may be partially or completely open on one or more sides without departing from the principles of the present disclosure. In one embodiment, the conductive cavity 52 is substantially continuous over at least two sides (e.g., a top and a bottom) of the inductive element 48. In another embodiment, the surfaces of the conductive cavity 52 are patterned, for example, into a grid. In yet another embodiment (shown), the conductive cavity 52 is substantially continuous but includes openings to allow coupling to the inductive element 48, the tunable capacitive element 50, and any other components that may be placed therein.

The conductive cavity 52 may be coupled to a fixed potential. For example, the conductive cavity 52 is shown coupled to ground in the exemplary embodiment of FIG. 6. However, the conductive cavity 52 may be coupled to any fixed potential, may be left floating, or may be coupled to a time-varying or frequency-varying signal without departing from the principles of the present disclosure. The capacitance distributed between the inductive element 48 and the conductive cavity 52 occurs due to the proximity of the conductive materials to one another. Accordingly, there is little to no parasitic resistance between the inductive element 48 and the distributed capacitance due to the conductive cavity 52 to damp the resonant response of the tunable resonator 46. In other words, the tunable resonator 46 includes many of the desirable performance characteristics of a cavity resonator without the large size thereof.

Figure 7:
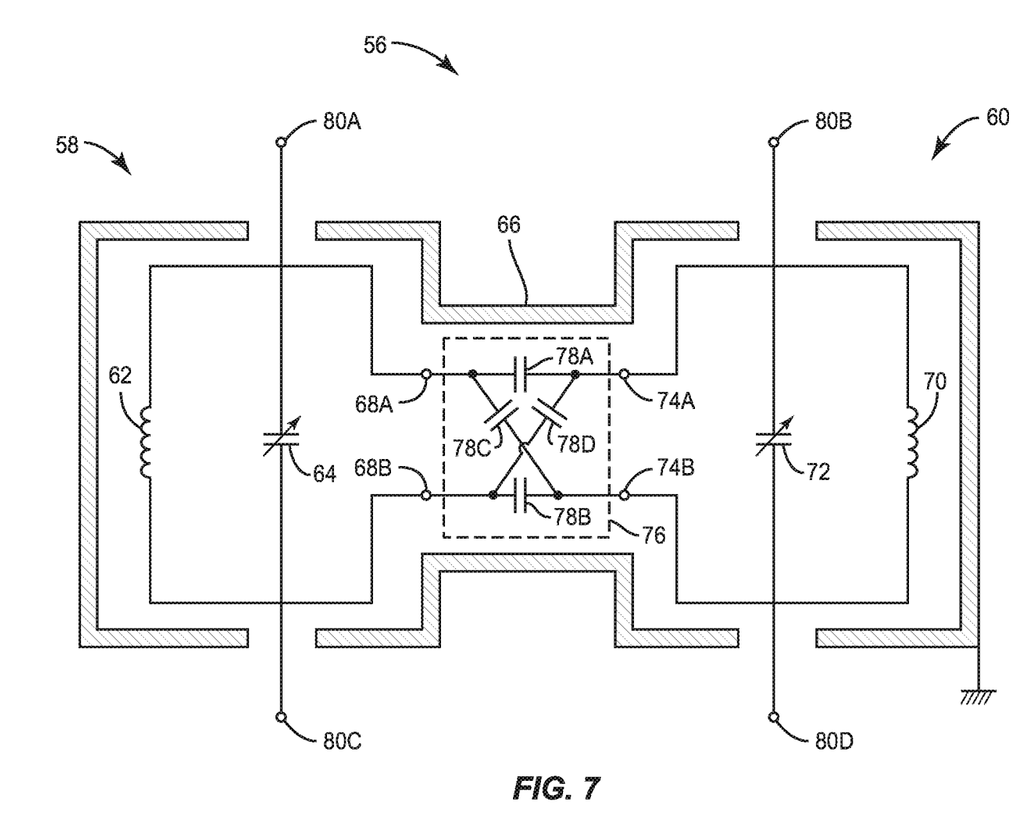
FIG. 7 illustrates a filter according to one embodiment of the present disclosure.

FIG. 7 shows a filter 56 including a first tunable resonator 58 and a second tunable resonator 60. The first tunable resonator 58 includes a first inductive element 62, a first tunable capacitive element 64, and a conductive cavity 66. The first inductive element 62 is within the conductive cavity 66. Further, in some embodiments the first tunable capacitive element 64 is also within the conductive cavity 66, although the first tunable capacitive element 64 may be outside of the conductive cavity 66 without departing from the principles of the present disclosure. The first inductive element 62 may be a conductive path (similar to that shown above with respect to FIG. 5) that runs along the periphery of a volume and is supported by a substrate (not shown). The first tunable capacitive element 64 may be a switched MIS capacitor, a semiconductor varactor, or the like. In one embodiment, the first tunable capacitive element 64 is coupled in parallel with the first inductive element 62 between a first input node 68A and a first output node 68B, however, the first tunable capacitive element 64 may be coupled in any configuration with the first inductive element 62 without departing from the principles of the present disclosure. The capacitance of the first tunable capacitive element 64 may be changed, for example, via a control signal delivered to the first tunable capacitive element 64, in order to adjust a resonant response of the first tunable resonator 58.

The second tunable resonator 60 is substantially similar to the first tunable resonator 58 and includes a second inductive element 70, a second tunable capacitive element 72, and the conductive cavity 66. The second inductive element 70 is within the conductive cavity 66. Further, in some embodiments the second tunable capacitive element 72 is also within the conductive cavity 66, although the second tunable capacitive element 72 may be outside of the conductive cavity 66 without departing from the principles of the present disclosure. The second inductive element 70 may be a conductive path (similar to that shown above with respect to FIG. 5) that runs along the periphery of a volume and is supported by a substrate (not shown). The second tunable capacitive element 72 may be a switched MIS capacitor, a semiconductor varactor, or the like. In one embodiment, the second tunable capacitive element 72 is coupled in parallel with the second inductive element 70 between a second input node 74A and a second output node 74B, however, the second tunable capacitive element 72 may be coupled in any configuration with the second inductive element 70 without departing from the principles of the present disclosure. The capacitance of the second tunable capacitive element 72 may be changed, for example, via a control signal delivered to the second tunable capacitive element 72, in order to adjust a resonant response of the second tunable resonator 60.

Coupling circuitry 76 connects the first input node 68A, the first output node 68B, the second input node 74A, and the second output node 74B. In one embodiment, the coupling circuitry 76 includes a first capacitive element 78A coupled between the first input node 68A and the second input node 74A, a second capacitive element 78B coupled between the first output node 68B and the second output node 74B, a third capacitive element 78C coupled between the first input node 68A and the second output node 74B, and a fourth capacitive element 78D coupled between the first output node 68B and the second input node 74A. In one embodiment, the first capacitive element 78A, the second capacitive element 78B, the third capacitive element 78C, and the fourth capacitive element 78D are tunable capacitive elements. Accordingly, the particular coupling between each one of the first input node 68A, the first output node 68B, the second input node 74A, and the second output node 74B may be adjusted as desired to obtain a particular filter response. Notably, the coupling circuitry 76 shown in FIG. 7 is only exemplary. Those of ordinary skill in the art will appreciate that any number of known coupling circuitries may be used in place of the coupling circuitry 76 without departing from the principles of the present disclosure.

A number of input/output nodes 80 may be coupled to various points of the first tunable resonator 58 and the second tunable resonator 60 in order to provide access thereto. For example, as shown in FIG. 7, a first input/output node 80A may be coupled to the first input node 68A, a second input/output node 80B may be coupled to the second input node 74A, a third input/output node 80C may be coupled to the first output node 68B, and a fourth input/output node 80D may be coupled to the second output node 74B. While not shown, any number of additional input/output nodes 80 may be coupled to any point in the filter 56. As discussed above, input/output nodes 80 may be placed along a length of the first inductive element 62 and/or the second inductive element 70 in order to provide access to a number of different delayed signals, which may provide additional functionality.

Generally, the first tunable capacitive element 64 should be located as close to the first inductive element 62 as possible via a high quality connection to avoid introducing parasitic resistance and thus degradation of the quality factor of the first tunable resonator 58. For the same reasons, the second tunable capacitive element 72 should be located as close to the second inductive element 70 as possible and use a high quality connection. The distributed capacitance between the conductive cavity 66 and the first inductive element 62 along with the capacitance of the first tunable capacitive element 64 combine to determine the resonant response of the first tunable resonator 58. Similarly, the distributed capacitance between the conductive cavity 66 and the second inductive element 70 along with the capacitance of the second tunable capacitive element 72 combine to determine the resonant response of the second tunable resonator 60. The distributed inductance and capacitance due to the length of the first inductive element 62 and the second inductive element 70 and the interaction of the first inductive element 62 and the second inductive element 70 with the conductive cavity 66 cause the first tunable resonator 58 and the second tunable resonator 60, respectively, to behave more like a cavity resonator than an LC resonator. In general, this means that the first tunable resonator 58 and the second tunable resonator 60 have high quality factors and high selectivity. Further, the first tunable resonator 58 and the second tunable resonator 60 have a small form factor when compared to a conventional cavity resonator. In one embodiment, the quality factor of the first tunable resonator 58 and the second tunable resonator 60 is greater than about 50. In some embodiments, the quality factor may be less than about 300. Further, the cross-sectional area of each one of the first tunable resonator 58 and the second tunable resonator 60 may be less than about 2 $mm^2$, thereby allowing the filter 56 to be integrated into portable electronic devices such as mobile communications devices.

In one embodiment, the space between the first inductive element 62 and the conductive cavity 66 and the second inductive element 70 and the conductive cavity 66 is empty space filled with air or an inert gas. In other embodiments, the space between the first inductive element 62 and the conductive cavity 66 and the second inductive element 70 and the conductive cavity 66 is filled with an encapsulant material of some kind (e.g., an oxide). While the conductive cavity 54 is shown substantially enclosing the first tunable resonator 58 and the second tunable resonator 60, the conductive cavity 66 may be partially or completely open on one or more sides without departing from the principles of the present disclosure. In one embodiment, the conductive cavity 66 is substantially continuous over at least two sides (e.g., a top and a bottom) of the first tunable resonator 58 and the second tunable resonator 60. In another embodiment, the surface of the conductive cavity 66 is patterned, for example, into a grid. In yet another embodiment (shown), the conductive cavity 66 is substantially continuous but includes openings to allow coupling to the various components of the first tunable resonator 58, the second tunable resonator 60, and any other components that may be placed therein.

The conductive cavity 66 may be coupled to a fixed potential. For example, the conductive cavity 66 is shown coupled to ground in the exemplary embodiment of FIG. 7. However, the conductive cavity 66 may be coupled to any fixed potential, may be left floating, or may be coupled to a time-varying or frequency-varying signal without departing from the principles of the present disclosure. The capacitance distributed between the first inductive element 62 and the conductive cavity 66 and the second inductive element 70 and the conductive cavity 66, respectively, occurs due to the proximity of the conductive materials to one another. Accordingly, there is little to no parasitic resistance between the first inductive element 62 and the distributed capacitance and the second inductive element 70 and the distributed capacitance, respectively, to dampen the resonant response of the first tunable resonator 58 and the second tunable resonator 60. In other words, the first tunable resonator 58 and the second tunable resonator 60 include many of the desirable performance characteristics of a cavity resonator without the large size thereof.

Figure 8:
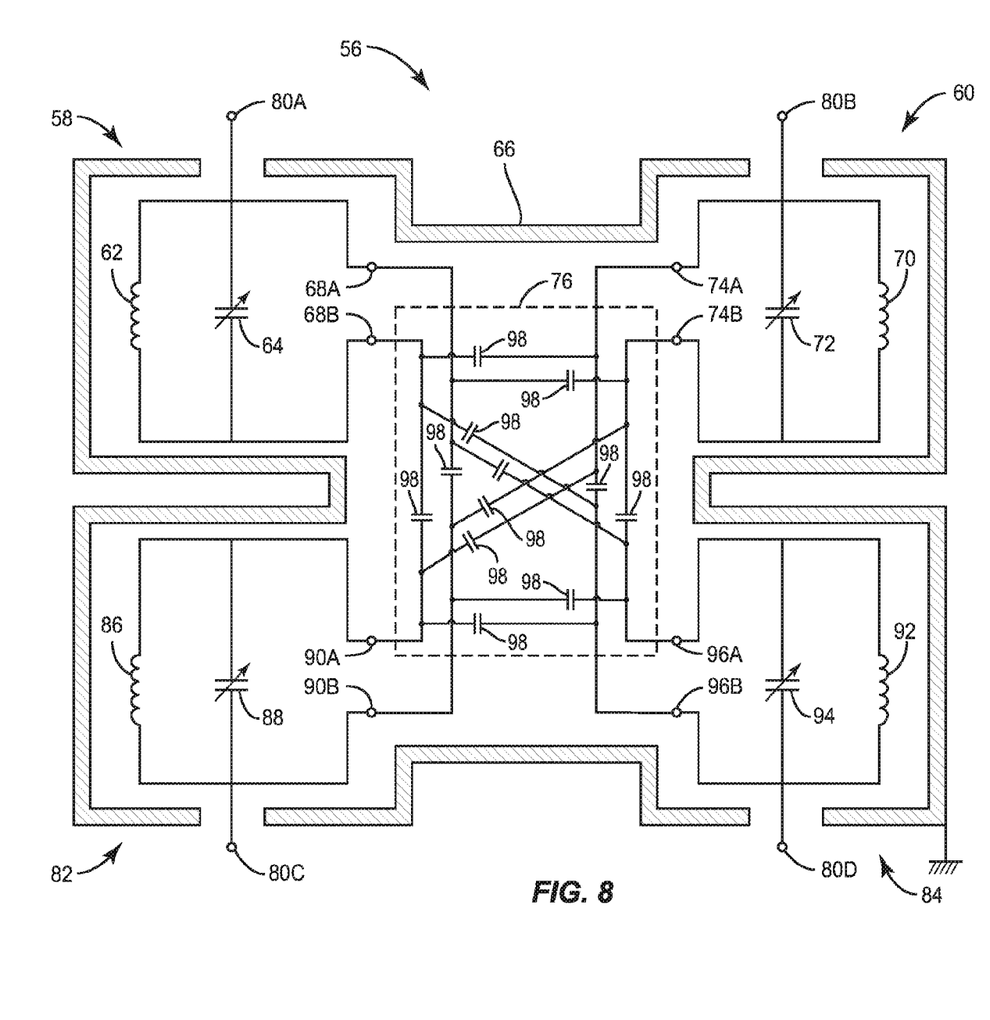
FIG. 8 illustrates the filter shown in FIG. 7 according to an additional embodiment of the present disclosure.

FIG. 8 shows the filter 56 according to an additional embodiment of the present disclosure. The filter 56 shown in FIG. 8 is substantially similar to that shown in FIG. 7, and includes the first tunable resonator 58 and the second tunable resonator 60. However, the filter 56 in FIG. 8 further includes a third tunable resonator 82 and a fourth tunable resonator 84. Further, the filter 56 in FIG. 8 includes changes to the coupling circuitry 76 in order to accommodate the third tunable resonator 82 and the fourth tunable resonator 84. The third tunable resonator 82 includes a third inductive element 86, a third tunable capacitive element 88, and the conductive cavity 66. The third inductive element 86 is within the conductive cavity 66 as discussed above. Further, the third tunable capacitive element 88 may also be in the conductive cavity 66, or may be located outside of the conductive cavity 66. The third inductive element 86 and the third tunable capacitive element 88 may be coupled in parallel between a third input node 90A and a third output node 90B, or may be coupled in any other desired configuration. The fourth tunable resonator 84 includes a fourth inductive element 92, a fourth tunable capacitive element 94, and the conductive cavity 66. The fourth inductive element 92 is within the conductive cavity 66 as discussed above. Further, the fourth tunable capacitive element 94 may also be in the conductive cavity 66, or may be located outside of the conductive cavity 66. The fourth inductive element 92 and the fourth tunable capacitive element 94 may be coupled in parallel between a fourth input node 96A and a fourth output node 96B, or may be coupled in any other desired configuration.

The coupling circuitry 76 includes a number of coupling capacitors 98 coupled between the first input node 68A, the first output node 68B, the second input node 74A, the second output node 74B, the third input node 90A, the third output node 90B, the fourth input node 96A, and the fourth output node 96B. The coupling capacitors 98 may be tunable capacitors in some embodiments such that the coupling capacitors 98 allow tuning of the coupling between each one of the first input node 68A, the first output node 68B, the second input node 74A, the second output node 74B, the third input node 90A, the third output node 90B, the fourth input node 96A, and the fourth output node 96B. Notably, the coupling circuitry 76 shown in FIG. 8 is only exemplary. Those of ordinary skill in the art will appreciate that any number of known coupling circuitries may be used in place of the coupling circuitry 76 without departing from the principles of the present disclosure.

Figure 9:
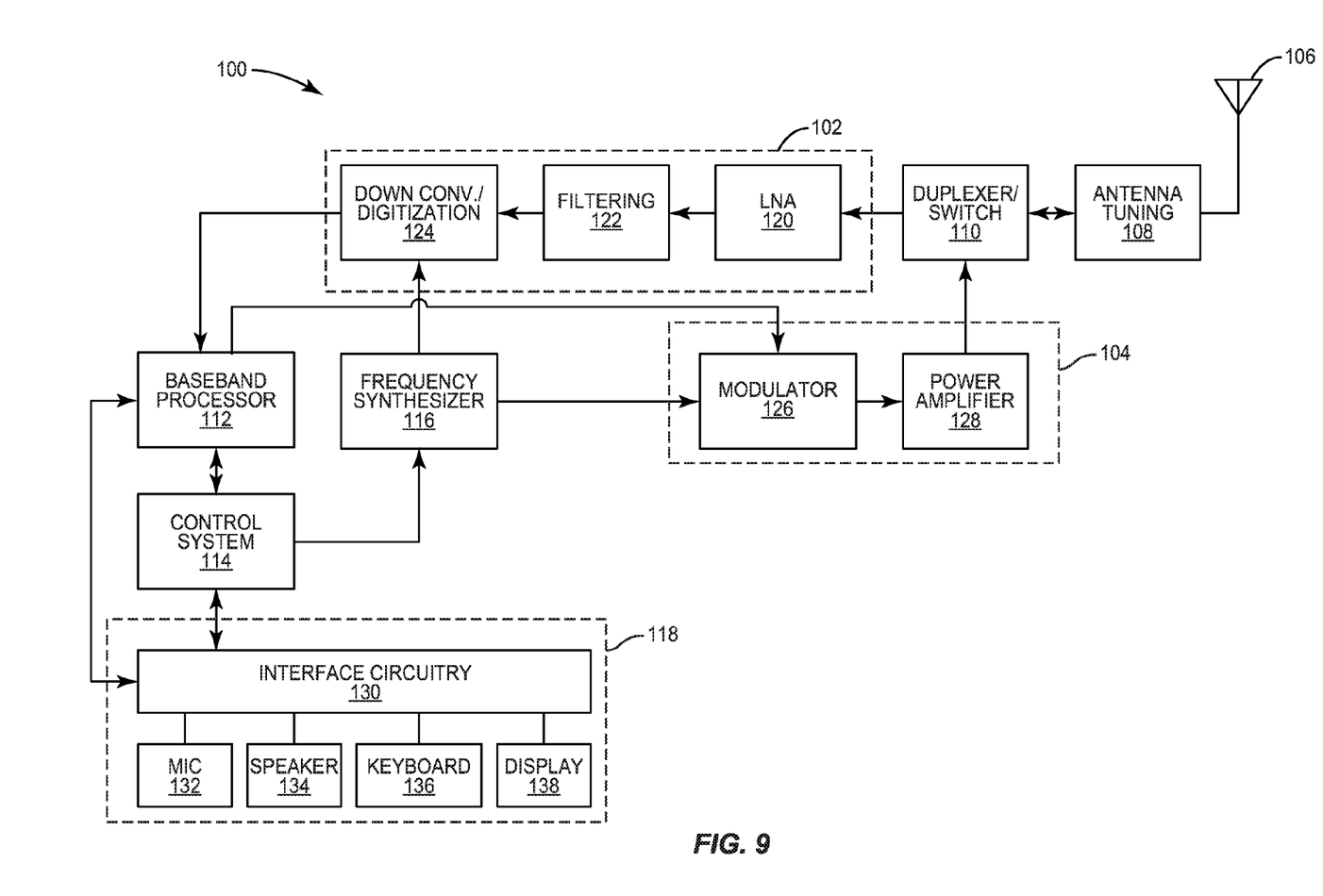
FIG. 9 illustrates a mobile terminal according to one embodiment of the present disclosure.

As discussed above, the resonator 32, the tunable resonator 46, and/or the filter 56 may be used in a mobile terminal 100, the basic architecture of which is shown in FIG. 9. The mobile terminal 100 may include a receiver front end 102, a radio frequency transmitter section 104, an antenna 106, antenna tuning circuitry 108, a duplexer/switch circuitry 110, a baseband processor 112, a control system 114, a frequency synthesizer 116, and a user interface 118.

The receiver front end 102 receives information bearing radio frequency signals from one or more remote transmitters provided by a base station (not shown). The radio frequency signals are delivered to the receiver front end 102 via the antenna tuning circuitry 108 and the duplexer/switch circuitry 110. A low noise amplifier (LNA) 120 amplifies the signal. Filtering circuitry 122 minimizes broadband interference in the received signal, while down conversion and digitization circuitry 124 down converts the filtered, received signal to an intermediate or baseband frequency signal, which is then digitized into one or more digital streams. The receiver front end 102 typically uses one or more mixing frequencies generated by the frequency synthesizer 116. The baseband processor 112 processes the digitized received signal to extract the information or data bits conveyed in the received signal. This processing typically comprises demodulation, decoding, and error correction operations. As such, the baseband processor 112 is generally implemented in one or more digital signal processors (DSPs).

On the transmit side, the baseband processor 112 receives digitized data, which may represent voice, data, or control information, from the control system 114, which it encodes for transmission. The encoded data is output to the transmitter 104, where it is used by a modulator 126 to modulate a carrier signal that is at a desired transmit frequency. Power amplifier circuitry 128 amplifies the modulated carrier signal to a level appropriate for transmission, and delivers the amplified and modulated carrier signal to the antenna 106 through the antenna tuning circuitry 108 and the duplexer or switch 110.

A user may interact with the mobile terminal 100 via the interface 118, which may include interface circuitry 130 associated with a microphone 132, a speaker 134, a keypad 136, and a display 138. The interface circuitry 130 typically includes analog-to-digital converters, digital-to-analog converters, amplifiers, and the like. Additionally, it may include a voice encoder/decoder, in which case it may communicate directly with the baseband processor 112. The microphone 132 will typically convert audio input, such as the user's voice, into an electrical signal, which is then digitized and passed directly or indirectly to the baseband processor 112. Audio information encoded in the received signal is recovered by the baseband processor 112, and converted by the interface circuitry 130 into an analog signal suitable for driving the speaker 134. The keypad 136 and the display 138 enable the user to interact with the mobile terminal 100, input numbers to be dialed, address book information, or the like, as well as monitor call progress information.

The resonator 32, the tunable resonator 46, and/or the filter 56 may be used to filter signals in the antenna tuning circuitry 108, the filtering circuitry 122, or any other portion of the mobile terminal 100. Using the resonator 32, the tunable resonator 46, and/or the filter 56 may provide performance enhancements to the mobile terminal 100 due to the high quality factor thereof. Further, due to the relatively small size of each one of the resonator 32, the tunable resonator 46, and the filter 56, the portability of the mobile terminal 100 will not be significantly affected.

Figure 10:
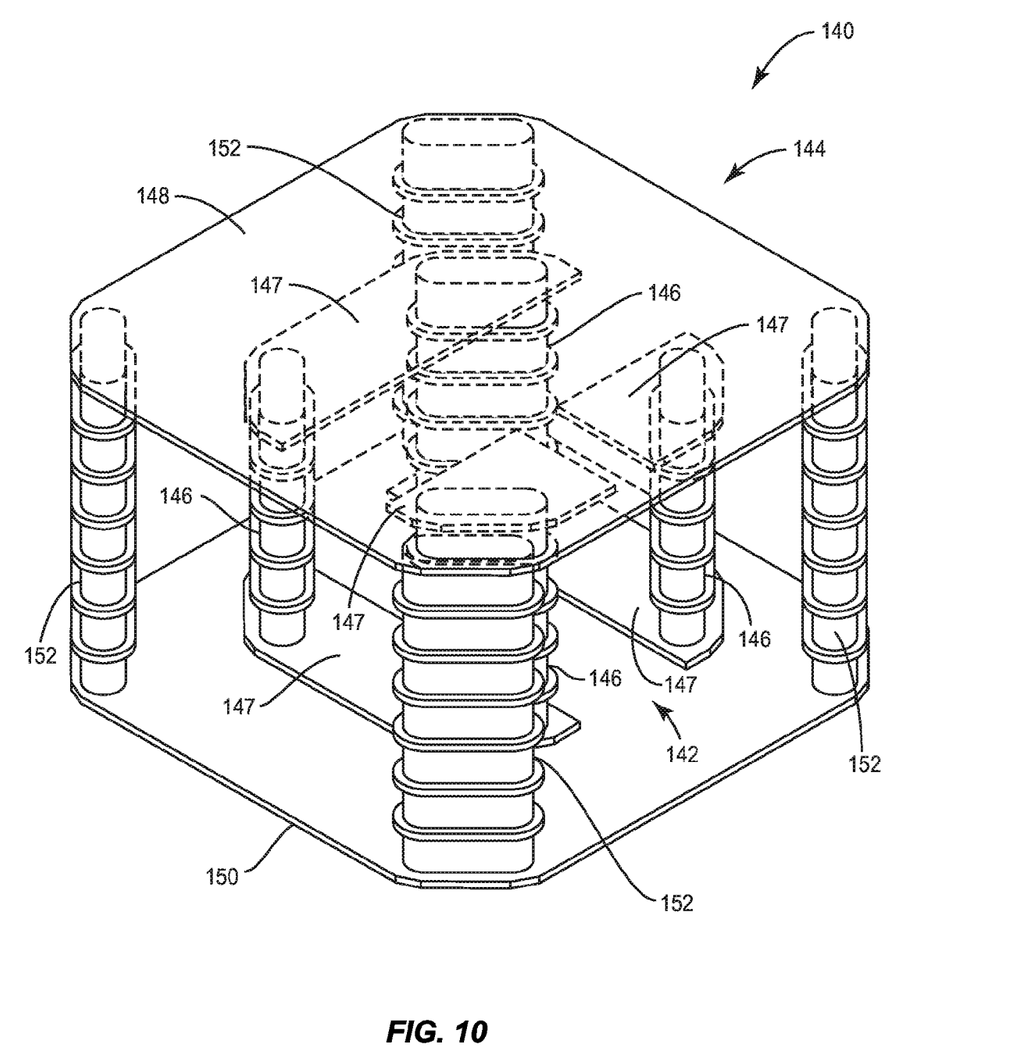
FIG. 10 illustrates a three-dimensional view of a resonator according to one embodiment of the present disclosure.

FIG. 10 shows details of a physical implementation of a resonator 140 according to one embodiment of the present disclosure. Specifically, FIG. 10 shows a resonator 140 including an inductive element 142 inside of a conductive cavity 144 as discussed above. The inductive element 142 is a three-dimensional inductor. However, specific details of the inductive element 142 are illustrated, such as the fact that one or more vertical connections 146 of the inductive element 142 are formed by a plurality of vias. Further, the vertical connections 146 are disposed at 45° with respect to a center of the inductive element 142. Disposing the vertical connections 146 at 45° in the inductive element 142 and forming the vertical connections 146 such that a width thereof is between about 25 µm and 1000 µm results in a uniform length for various current paths in the inductive element 142 from a cross-sectional perspective. In other words, the particular disposition, width, and thickness of the conductive path of the inductive element 142 ensure a substantially uniform current distribution therein. Top and bottom conductive traces 208 of the inductive element 142 are also relatively wide (between 25 µm and 1000 µm) to reduce resistive losses within the inductive element 142. In various embodiments, the width of the vertical connections 146 and the top and bottom conductive traces 208 may be the same or different. Additional details regarding various inductive elements that may be used along with the principles of the present disclosure may be found in co-pending and co-assigned U.S. Pat. No. 9,196,406, the contents of which are herein incorporated by reference in their entirety. The conductive cavity 144 is formed from a top plate 148 and a bottom plate 150, which are connected by vertical connectors 152 formed by a number of vias. While the vertical connectors 152 are only shown at the corners of the top plate 148 and the bottom plate 150, additional vertical connectors (not shown) may be placed to essentially surround the inductive element 142 or any further portion thereof as well.

Those skilled in the art will recognize improvements and modifications to the embodiments of the present disclosure. All such improvements and modifications are considered within the scope of the concepts disclosed herein and the claims that follow.

What is claimed is:

1. A resonator comprising:
   an inductive element comprising a conductive path routed along a periphery of a volume between an input node and an output node such that the inductive element is a three-dimensional inductor with a length between about 0.5 mm and 20 mm; and
   a conductive cavity surrounding the inductive element such that a capacitance is distributed between the inductive element and the conductive cavity along a length of the inductive element.

2. The resonator of claim 1 wherein the conductive cavity is coupled to a fixed potential.

3. The resonator of claim 1 wherein the conductive path comprises:
   one or more vertical connectors, each disposed at an angle of 45° with respect to a center of the inductive element; and
   one or more conductive traces connecting the one or more vertical connectors.

4. The resonator of claim 1 wherein a delay between the input node and the output node is between about 0.5 ns and 50 ns.

5. The resonator of claim 1 wherein the conductive cavity encloses the volume such that the conductive path runs parallel to one or more surfaces of the conductive cavity.

6. The resonator of claim 1 wherein the inductive element further comprises at least one intermediate node between the input node and the output node.

7. The resonator of claim 6 wherein a delay between the input node and the at least one intermediate node is different from a delay between the input node and the output node.

8. The resonator of claim 1 further comprising a tunable capacitive element coupled to the inductive element.

9. The resonator of claim 8 wherein the conductive cavity further surrounds the tunable capacitive element.

10. The resonator of claim 9 wherein the conductive cavity is coupled to a fixed potential.

11. The resonator of claim 1 wherein the conductive cavity encloses the volume such that the conductive path runs parallel to one or more surfaces of the conductive cavity.

12. A filter comprising:
    a plurality of inductive elements each comprising a conductive path routed along a periphery of a volume between an input node and an output node such that the inductive element is a three-dimensional inductor with a length between about 0.5 mm and 20 mm;
    a plurality of tunable capacitive elements, each coupled to a different one of the plurality of inductive elements; and
    a conductive cavity surrounding at least one of the plurality of inductive elements such that a capacitance is distributed between each one of the plurality of inductive elements and the conductive cavity along a length of the at least one of the plurality of inductive elements surrounded by the conductive cavity.

13. The filter of claim 12 wherein the conductive cavity surrounds all of the plurality of inductive elements.

14. The filter of claim 12 wherein the conductive path of each one of the plurality of inductive elements runs parallel to one or more surfaces of the conductive cavity.

15. A resonator comprising:
    an inductive element comprising a conductive path routed along a periphery of a volume between an input node and an output node such that the inductive element is a three-dimensional inductor; and
    a conductive cavity surrounding the inductive element such that a capacitance is distributed between the inductive element and the conductive cavity along a length of the inductive element and a delay between the input node and the output node is between about 0.5 ns and 50 ns.

16. A resonator comprising:
    an inductive element including one or more vertical connectors, each disposed at an angle of 45° with respect to a center of the inductive element and one or more conductive traces connecting the one or more vertical connectors; and
    a conductive cavity surrounding the inductive element such that a capacitance is distributed between the inductive element and the conductive cavity along a length of the inductive element.

* * * * *